United States Patent
Smirnov (10) Patent No.: US 8,445,879 B2
(45) Date of Patent: May 21, 2013

(54) COMPOSITIONS FOR PROTECTION AGAINST ELECTROMAGNETIC RADIATION EXPOSURE

(76) Inventor: Igor Smirnov, Encinitas, CA (US)

(*) Notice: Subject to any disclaimer, the term of this patent is extended or adjusted under 35 U.S.C. 154(b) by 0 days.

(21) Appl. No.: 13/364,622

(22) Filed: Feb. 2, 2012

(65) Prior Publication Data

US 2012/0124818 A1  May 24, 2012

Related U.S. Application Data

(63) Continuation of application No. 12/036,240, filed on Feb. 23, 2008, now abandoned.

(51) Int. Cl.
*G21F 5/00* (2006.01)

(52) U.S. Cl.
USPC .............. 250/506.1; 250/515.1; 250/516.1

(58) Field of Classification Search
USPC ................... 250/506.1, 515.1, 516.1
See application file for complete search history.

(56) References Cited

U.S. PATENT DOCUMENTS

| | | | |
|---|---|---|---|
| 4,829,096 A | 5/1989 | Kitamura et al. | |
| 5,814,178 A | 9/1998 | Jacobs | |
| 6,001,282 A | 12/1999 | Kanase | |
| 6,179,939 B1 | 1/2001 | Jones, Jr. et al. | |
| 6,309,736 B1 | 10/2001 | McCormack et al. | |
| 6,369,399 B1 | 4/2002 | Smirnov | |
| 6,423,776 B1 | 7/2002 | Akkapeddi et al. | |
| 6,888,486 B2 | 5/2005 | König | |

OTHER PUBLICATIONS

Smirnov, Polymer Material Providing Compatibility Between Technologically Originated EMR and Biological Systems, Explore! vol. 15, No. 4, 2006.

*Primary Examiner* — Michael C Miggins
(74) *Attorney, Agent, or Firm* — Biotech Beach Law Group PC (57) ABSTRACT

The present invention provides compositions for the protection against electromagnetic radiation. The compositions include a polymeric material including a polyamide such as nylon 6 or nylon 6, 6, barium sulfate and magnesium sulfate. The polymeric material upon exposure to incident electromagnetic radiation emits subtle electromagnetic oscillations at probiotic frequencies that counter adverse effects of incident electromagnetic radiation. The polymeric material may be formed into a protective housing for electronic devices and may be formed into protective fabrics.

15 Claims, 4 Drawing Sheets

Control 2              TREO-MRET

| | Control 2 | | | TREO-MRET | | |
|---|---|---|---|---|---|---|
| | Values | Normal | Units | Values | Normal | Units |
| iI | 28.6 | 17.6 - 21 | uA | 12.8 | 17.6 - 21 | uA |
| iR | 45.5 | 63-74.4 | KOhm | 100 | 63-74.4 | KOhm |
| iC | 21.98 | 13.4-15.8 | 10-6 S.m-1 | 10 | 13.4-15.8 | 10-6 S.m-1 |
| ipH | 7.358 | 7.31-7.35 | I.U | 7.319 | 7.31-7.35 | I.U |
| icpH | 6.992 | 7.00-7.04 | I.U | 7.031 | 7.00-7.04 | I.U |
| tVO2 | 52.8 | 48-52 | % | 48.9 | 48-52 | % |
| tO2 | 80.4 | 82-86 | mm/Hg | 85.1 | 82-86 | mm/Hg |
| tCO2 | 42.8 | 38-42 | mm/Hg | 38.9 | 38-42 | mm/Hg |
| ATP | 57 | 44-45 | % | 47.2 | 44-45 | % |
| Microcirculation | | | | | | |
| blood pressure | 13.4 | 11-13 | cm/Hg | 11.4 | 11-13 | cm/Hg |
| blood viscosity | 5.2 | 4-5 | 10-4Pa/s | 4.2 | 4-5 | 10-4Pa/s |
| Interstitial viscosity | 1.3 | 1.4-1.8 | 10-4Pa/s | 1.7 | 1.4-1.8 | 10-4Pa/s |
| iWater content | 17.4 | 15-17 | % | 15.4 | 15-17 | % |
| Neuronal excitability: Increased | | | | Neuronal excitability: Norms | | |

Zone of the Right Frontal Lobe

Control 2                     TREO-MRET

FIG. 1A

Control 2                     TREO-MRET

|  | Values | Normal | Units | Values | Normal | Units |
|---|---|---|---|---|---|---|
| il | 28.6 | 17.6 - 21 | uA | 12.8 | 17.6 - 21 | uA |
| iR | 45.5 | 63-74.4 | KOhm | 100 | 63-74.4 | KOhm |
| iC | 21.98 | 13.4-15.8 | 10-6 S.m-1 | 10 | 13.4-15.8 | 10-6 S.m-1 |
| ipH | 7.358 | 7.31-7.35 | I.U | 7.319 | 7.31-7.35 | I.U |
| icpH | 6.992 | 7.00-7.04 | I.U | 7.031 | 7.00-7.04 | I.U |
| tVO2 | 52.8 | 48-52 | % | 48.9 | 48-52 | % |
| tO2 | 80.4 | 82-86 | mm/Hg | 85.1 | 82-86 | mm/Hg |
| tCO2 | 42.8 | 38-42 | mm/Hg | 38.9 | 38-42 | mm/Hg |
| ATP | 57 | 44-45 | % | 47.2 | 44-45 | % |
| Microcirculation | | | | | | |
| blood pressure | 13.4 | 11-13 | cm/Hg | 11.4 | 11-13 | cm/Hg |
| blood viscosity | 5.2 | 4-5 | 10-4Pa/s | 4.2 | 4-5 | 10-4Pa/s |
| Interstitial viscosity | 1.3 | 1.4-1.8 | 10-4Pa/s | 1.7 | 1.4-1.8 | 10-4Pa/s |
| iWater content | 17.4 | 15-17 | % | 15.4 | 15-17 | % |

Neuronal excitability: Increased           Neuronal excitability: Norms

FIG. 1B : Zone of the Right Frontal Lobe

| | Control 2 | | | TREO-MRET | | |
|---|---|---|---|---|---|---|
| | Values | Normal | Units | Values | Normal | Units |
| iI | 15.2 | 17.6 - 21 | uA | 14.6 | 17.6 - 21 | uA |
| iR | 87.2 | 63-74.4 | KOhm | 90.40 | 63-74.4 | KOhm |
| iC | 11.47 | 13.4-15.8 | 10-6 S.m-1 | 11.06 | 13.4-15.8 | 10-6 S.m-1 |
| ipH | 7.325 | 7.31-7.35 | I.U | 7.323 | 7.31-7.35 | I.U |
| icpH | 7.025 | 7.00-7.04 | I.U | 7.027 | 7.00-7.04 | I.U |
| tVO2 | 49.5 | 48-52 | % | 49.3 | 48-52 | % |
| tO2 | 84.5 | 82-86 | mm/Hg | 84.7 | 82-86 | mm/Hg |
| tCO2 | 39.5 | 38-42 | mm/Hg | 39.3 | 38-42 | mm/Hg |
| ATP | 48.8 | 44-45 | % | 48.2 | 44-45 | % |
| Microcirculation | | | | | | |
| blood pressure | 11.8 | 11-13 | cm/Hg | 11.6 | 11-13 | cm/Hg |
| blood viscosity | 4.4 | 4-5 | 10-4Pa/s | 4.3 | 4-5 | 10-4Pa/s |
| Interstitial viscosity | 1.6 | 1.4-1.8 | 10-4Pa/s | 1.7 | 1.4-1.8 | 10-4Pa/s |
| iWater content | 15.8 | 15-17 | % | 15.6 | 15-17 | % |
| Neuronal excitability: Norms | | | | Neuronal excitability: Norms | | |

FIG. 1C : Right Temporal Zone

FIG. 2A : Phantom Head Without MRET

FIG. 2B: Phantom Head with MRET

COMPOSITIONS FOR PROTECTION AGAINST ELECTROMAGNETIC RADIATION EXPOSURE

TECHNICAL FIELD

The present invention relates to compositions for the protection of living cells or organisms against electromagnetic radiation and more particularly to polymeric materials including a polyamide, barium sulfate and magnesium sulfate capable of preventing adverse effects associated with exposure to electromagnetic radiation and products formed therefrom.

BACKGROUND OF THE INVENTION

Electromagnetic radiation (EMR) is a self-propagating wave in space with electric and magnetic components. These components oscillate at right angles to each other. EMR is classified into types according to the frequency of the wave: these types include, in order of increasing frequency, radio waves, microwaves, terahertz radiation, infrared radiation, visible light, ultraviolet radiation, X-rays and gamma rays.

EMR is emitted by every operating electrical and electronic device. The power of EMR emission varies depending on the size and electrical strength of the device and the electrical current it carries or employs. High voltage power lines are significant emitters of EMR, and field strengths sufficiently high to have the potential for causing adverse EMR effects in humans, animals and plants. Effects can be detected hundreds of feet away. Smaller devices such as computers, television sets, microwave ovens and the like emit lesser quantities of EMR, but the effect on humans can still be significant because people are in much closer proximity to such devices.

Electromagnetic radiation carries energy and momentum, which may be imparted when it interacts with matter. Thus once struck, the matter can be affected. While the effect may vary depending on frequency and amplitude, there are biological effects that can be modulated by exposure to electromagnetic radiation. Among the effects believed to be associated with exposure to electromagnetic radiation include the disruption of hydrogen bonding. Thus, exposure to such radiation may disrupt the natural hydrogen bonding of compounds or molecules. This also affects the hydrogen bonding of water molecules. Therefore there is a particular concern regarding the exposure of areas of the body that are highly fluid, such as within the brain or blood stream. Thus while the effects of electromagnetic radiation are not widely accepted by all, it is nonetheless the desire of many prudent people to protect themselves, their animals and plants against whatever health risks might be involved by their exposure to electromagnetic radiation. Adverse human health effects that have been reported as attributable to long-term electromagnetic radiation exposure include but are not limited to occurrence of certain cancers, multiple sclerosis and autism. Adverse effects on animals have including stillbirths of young and reduction of milk production in cattle have also been reported.

Unfortunately, effective and convenient devices for shielding against EMR are not generally available. Essentially the only defense against EMR has been removal of persons, animals and plants from proximity to the EMR-emitting devices. For major emitters such as power lines or electrical substations, this has usually meant that one has had to move to a different house or to a different job location away from the power line or substation, which commonly means substantial expense and inconvenience. The adverse costs and inconveniences are similar to farmers and ranchers who must move animals and crops to locations remote from the power lines or stations. For devices such as microwave ovens or computers, it has meant that a person must sit or stand at an awkward distance from the device, which can impair the person's ability to use the device in an optimum manner.

The inventor of the present invention has proposed compositions for such protection in the past. U.S. Pat. No. 6,369,399 teaches compositions for the protection against electromagnetic radiation. The compositions include a material including an oxydated hydrocarbon emulsifier; a galvanic salt; an alkaloid; a dye or stain; and a polysaccharide. Although the compositions did demonstrate protection against electromagnetic radiation, the preparation of such a material was complex and therefore its widespread adoption was hindered. Thus there remains a need to develop compositions capable of protecting against electromagnetic radiation that are less complex and easier to adapt to a variety of uses.

SUMMARY OF THE INVENTION

The present invention addresses the need to provide compositions for the protection against electromagnetic radiation and provides related benefits. Thus it is the primary object of the present invention to provide compositions that protect against adverse effects associated with exposure to electromagnetic radiation. It is another object of the present invention to provide housings or portions thereof for electronic devices that emit electromagnetic frequencies to reduce adverse effects associated with the use of such electronic devices. It is yet another object of the present invention to provide fabrics and protective garments capable of protecting against exposure to electromagnetic radiation.

In one aspect of the present invention a polymeric material is provided to reduce adverse effects of electromagnetic radiation exposure. The polymeric material includes a polyamide such as nylon 6 or nylon 6, 6, barium sulfate and magnesium sulfate. The polymeric material upon exposure to incident electromagnetic radiation emits subtle electromagnetic oscillations at probiotic frequencies that counter or reduce adverse effects of incident electromagnetic radiation. The polymeric material may be used for the protection of humans, animals, plants, eukaryotic cells or organisms and the like. The polymeric material may be formed into a protective housing for electronic devices and may be formed into protective fabrics.

In another aspect of the present invention, a housing for an electronic device that emits electromagnetic radiation is provided. The housing includes a polymeric material including a polyamide, barium sulfate, and magnesium sulfate in an amount suitable to reduce exposure to such radiation. The housing, upon exposure to incident electromagnetic radiation, emits subtle electromagnetic oscillations at probiotic frequencies that protect the user against incident electromagnetic radiation. In some embodiments the polyamide is nylon such as nylon 6 or nylon 6, 6. Examples of electronic devices that may benefit from the housing include wireless telephones, cordless telephones, audio players such as MP3 players and others, wireless headsets, headphones, computers, televisions and the like.

In another aspect of the present invention a fabric or a protective garment constructed from fabric is provided to protect against exposure to electromagnetic radiation. The fabric includes a polymeric material including a polyamide, barium sulfate and magnesium sulfate. Fabrics of the present invention are believed to emit subtle electromagnetic oscillations at probiotic frequencies when exposed to incident electromagnetic radiation.

BRIEF DESCRIPTION OF THE FIGURES

FIG. 2A displays results from exposing the "phantom head" to the control cellular telephone (no polymeric material included within the test polymer) and FIG. 2B displays results from exposing the "phantom head" to a cellular phone with a polymer including 1 gram of the polymeric material (referred to as MRET) As can be viewed in FIGS. 2A and 2B, the effect of incorporating 1 gram of the polymeric material on the "phantom head" showed that the "Hot Spots" remained in the same location as without the polymeric material; however, the amplitudes decreased in 80% of the data points. About 60% of the data points were observed to have a significant decrease in SAR values in the range of 10% to 50%. Thus, the incorporation of the polymeric material in the "phantom head" study demonstrated a reduction in the majority of SAR values. 12 SAR values out of 16 meaningful SAR values in this experiment were reduced in the range of 16.5%-32.6%, and only 3 SAR values increased by 1.0%-5.6%.

DETAILED DESCRIPTION OF PREFERRED EMBODIMENTS

As an introduction, the present invention provides polymeric materials and compositions formed therefrom to protect against exposure to electromagnetic radiation, such as electromagnetic frequencies emitted from electronic devices, power lines and the like. Compositions provided herein have been tested for their ability to protect against electromagnetic radiation by measuring a variety of biological indicators associated with brain chemistry in the interstitial fluid and have demonstrated the ability to reduce or counteract abnormal shifts identified upon exposure to electromagnetic radiation. In view of the present disclosure, one skilled in the art to which the present invention belongs will be able to provide a variety of protective housings, structures, fabrics and the like that provide as an element, a polymeric material including a polyamide in combination with barium sulfate and magnesium sulfate. Thus the polymeric compositions of the present invention can be adapted for use as a protective barrier against exposure to electromagnetic radiation; as protective housings or portions thereof for electronic devices that emit frequencies that adversely effect biological systems; and can be woven into fabrics for production of protective garments. The following description provides various preferred embodiments and uses for the polymeric material described herein. The various embodiments are intended to be nonlimiting since the polymeric materials may be varied or adapted for many protective uses.

In one aspect of the present invention a polymeric material is provided to reduce adverse effects of electromagnetic radiation exposure. The polymeric material includes a polyamide such as nylon 6 or nylon 6, 6, barium sulfate and magnesium sulfate. Though nonlimiting, the polymeric material of the present invention is believed to emit subtle electromagnetic oscillations at probiotic frequencies that counter adverse effects of incident electromagnetic radiation. The polymeric material has been demonstrated as useful in reducing exposure to electromagnetic radiation and can be thus be provide to protect humans, animals, eukaryotic cells, plants and the like.

Referring to the new combination of compounds and the beneficial results described herein, the present invention utilizes a polymeric material including a polyamide, barium sulfate and magnesium sulfate. The polymeric material is capable of reducing the effects of exposure from electronic devices and can be incorporated into a variety of housings, fabrics and protective structures. Though nonlimiting, the preferred polyamide is nylon-6 or nylon-6, 6. In the preferred embodiment the ratio by weight of the polymeric material is about ten parts by weight polyamide, about two parts by weight barium sulfate, and about one part by weight magnesium sulfate. However other embodiments include variations on these ratios. In some embodiments, the amount of one or more of the compounds varies by about 10%. In another embodiment, the amount of one or more of the compounds varies by about 15%. In still other embodiments, the amount of one or more of the compounds varies by about 20%. Thus the ratios provided herein correspond to preferred embodiments found during development but are not intended to limit the scope of the present invention. One may determine the particular desired ratio by varying ratios of each compound, forming a protective structure such as a housing or fabric and testing the ability to protect against electromagnetic radiation. In some embodiments, electro interstitial scan (EIS) analysis can be used to test for protective properties. In alternative embodiments a "phantom head" or "phantom body" study may be used to assess affects against electromagnetic radiation.

The polyamide provides the primary polymer backbone to which the barium sulfate and magnesium sulfate interact or bind to form the polymeric material of the present invention. Polyamides are monomers of amides linked by peptide bonds. Although some polyamides occur naturally, such as those found in wool and silk, others are formed artificially. Polyamide polymers are frequently produced by condensation reactions between an amino group on one polymer and a carboxylic acid or acid chloride group on the opposing polymer. These reactions typically eliminate water, ammonia or hydrogen chloride thereby resulting in a polyamide chain. In the preferred embodiment of the present invention, the polyamide provided in the polymeric material is a nylon. Nylons are some of the most common polymers used as synthetic fibers and thus compositions of the present invention may be provided as substitutions for nylons for the preparation of fibers if the protective features of the present invention are desired. Nylons are commonly used in the clothing industry and the plastics industry. Most preferably, the polyamide of the present invention is nylon 6, 6 or nylon 6.

Nylon-6, 6, which is also referred to those skilled in the present art as polyamide 6-6 or PA66, is a semicrystalline polyamide commonly used in fiber applications such as carpeting, clothing and tire cord. It is also used as an engineering material in bearings and gears due to its good abrasion resistance and self-lubricating properties. Nylon-6, 6 includes repeating units of the formula $C_{12}H_{22}O_2N$, has a molecular weight of about 226.32 g/mol and can be formed by condensation reactions of a diamine and a dicarboxylic acid or acid chloride, such as hexamethylene diamine and adipoyl chloride, so that peptide bonds form at both ends of the monomers. The numerical indications within nylons indicate the number of carbons donated by the monomers; the diamine first and the diacid second. Thus nylon-6, 6, refers to the donation of 6 carbons from the diamine and 6 carbons from the diacid to form the polymer chain and is a repeating unit of alternating monomers, one after another. The polymer reaction is typically performed in an aqueous solvent.

Nylon-6, also referred to as polyamide 6 or PA6, is a semicrystalline polyamide used most commonly in tire cord. Nylon-6 has a lower melting temperature compared to nylon 6, 6 and in general is believed to have better affinity towards dyes, tends to be more elastic and tends to be more resistant to weathering. Thus in some instances one may prefer to use nylon-6 depending on the resulting material, housing, structure, fabric and the like. The determination of which to use is well within the ability of one skilled in the present art. Referring back to the compound, nylon-6 is repeating unit of $C_6H_{11}ON$ with a molecular weight per unit of 113.16 g/mol. Nylon-6 is not a condensation polymer but instead is formed by a ring-opening polymerization reaction of the monomer caprolactam. Like nylon 6, 6, the technique for preparing nylon 6 is well known in the art. Nylon-6 was developed by DuPont and may be obtained from a variety of sources such as Sigma-Alderich (St. Louis, Mo.).

Barium sulfate is often provided as a fine white powder and has the chemical formula $BaSO_4$. Generally it is poorly soluble in water and other traditional solvents but is soluble in concentrated sulfuric acid. Barium sulfate is commercially available through a variety of vendors including Sigma-Aldrich (St. Louis, Mo.). The preferred ratio of barium sulfate to polyamide is 20 grams barium sulfate to 100 grams nylon 6 or nylon 6, 6. The preferred embodiment is nonlimiting and thus more or less barium sulfate may also be used as long as protective properties are maintained. In one embodiment the ratio of barium sulfate to polyamide is about 20-25 grams of barium sulfate per 100 grams of polyamide. In another embodiment the ratio of barium sulfate to polyamide is about 25-30 grams of barium sulfate per 100 grams of polyamide. In another embodiment the ratio of barium sulfate to polyamide is about 15-20 grams per 100 grams of polyamide. In another embodiment the ratio of barium sulfate to polyamide is about 10-15 grams per 100 grams of polyamide. Thus the ratios are intended to provide various useful ranges, which may be considered by one skilled in the art for the particular use, and are intended to be nonlimiting.

Magnesium sulfate is often provided as transparent crystals or a white powder and has the chemical formula $MgSO_4$. It can also be found as a heptahydrate, $MgSO_4.7H_2O$. Magnesium sulfate is available through a variety of vendors including Sigma-Alderich (St. Louis, Mo.). The preferred ratio of magnesium sulfate to polyamide is 10 grams per 100 grams polyamide. In another embodiment the ratio of magnesium sulfate to polyamide is 10-15 grams per 100 grams polyamide. In another embodiment the ratio of magnesium sulfate to polyamide is 15-20 grams per 100 grams polyamide. In another embodiment the ratio of magnesium sulfate to polyamide is 7-10 grams per 100 grams polyamide. In another embodiment the ratio of magnesium sulfate to polyamide is 3-7 grams per 100 grams polyamide. Thus the ratios provided herein are useful as guidance for the formation of protective materials, housings, structures and fabrics but are intended as nonlimiting with respect to scope of the present invention.

Compositions according to the present invention are formed by preparing the protective polymeric material then casting, molding or manipulating the material to form the desired product. In general, the polyamide is formed into a polymer chain then the barium sulfate and magnesium sulfate are added to the chain. The polyamide polymer may be purchased as single monomers or polymers and may be polymerized using chemistries that correspond to the particular polyamide or desired polymer. In one example, a condensation reaction is used to form a polyamide including nylon-6, 6. In another example ring opening polymerization is performed using caprolactam to form a nylon-6 polymer. After forming a polymer backbone, conventional chemistries can be used to form ester linkages or covalent bonds between the polymer backbone and the barium sulfate or magnesium sulfate. Once combined and allowed to react, a polymer incorporating the polyamide, barium sulfate and magnesium sulfate is formed. The resulting polymeric material is viscous slurry, which can be further processed to form desired protective housings, structures, fabrics and the like. As a nonlimiting exemplary embodiment, formation of the polymeric material may include mixing magnesium sulfate, barium sulfate and the polyamide at ratios provided herein and adding the mixture to a compounding machine. The operation of compounding machines for the preparation of polymeric materials is well known to those skilled in the present art and is intended to be nonlimiting. The mixture is heated to melt the polyamide and to absorb or combine with the magnesium sulfate and barium sulfate. Temperatures may vary depending on the melting temperature of the polyamide and may be about 250 degrees C. The mixture can then be forced through holes for the production of thread-like materials which can be cooled and cut into desired sized threads, pieces, granules and the like. Once cut the product may be collected for desired applications. The polymeric material may be further processed or formed as desired.

In addition to the magnesium sulfate and barium sulfate, the polymeric material may also include compounds that affect the characteristics of the resulting composition according to the desires of the user. In some embodiments, one or more dyes are added to enhance or alter the coloring of the composition. In other embodiments, fillers are added to increase or decrease the density of the resulting polymeric matrix. In still other embodiments, compositions are coated with a coating to enhance sheen or reflective properties.

As will become apparent to one skilled in the art to which the present invention belongs, the polymeric materials of the present invention may be cast or molded to form a variety of shapes and therefore a variety of protective housings. Thus it is another aspect of the present invention to provide a housing for an electronic device that is capable of protecting a user against electromagnetic radiation emitted from the electronic device. The housing includes a polyamide, such as nylon 6 or nylon 6, 6; barium sulfate; and magnesium sulfate. It is believe that the housing upon exposure to incident electromagnetic radiation emits subtle electromagnetic oscillations at probiotic frequencies that protect the user against the incident electromagnetic radiation. Casting and molding techniques are well are known in the plastic and polymer arts and are incorporated herein. Thus although the present invention provides increased protection against electromagnetic radiation, features such as viscosity and molding characteristics remain largely unchanged allowing conventional casting and molding techniques to be utilized. As with many nylons, the polymeric material of the present invention may also be provided as fibers or in a fibrous configuration for the preparation or weaving of protective fabrics. Thus one skilled in the art would readily acknowledge the present invention is not limited by a composition's size or configuration as the polymeric material may be formed in any suitable size or shape using known casting or molding techniques.

The polymeric material of the present invention has particular utility as a protective housing for electronic devices. Many electronic devices emit electronic radiation. Thus in some preferred embodiments of the present invention the polymeric material is formed into a rigid housing to house an electronic device. It is believed that by encasing the electronics in a housing according to the present invention, the effect of frequencies generated by such devices on humans, plants and the like will be minimized. It is believed that the frequencies emitted from the electronic device will act as a carrier allowing the delivery of the subtle low frequencies emitted from the polymeric material to occur in combination with the harmful frequencies generated from the electrical device. Thus by delivering the protective frequency in combination with the harmful frequency, the overall effect from the electrical device is reduced or minimized. In some embodiments the polymeric material does not make up the entire housing but instead only a portion of the housing. In these embodiments, the polymeric material may be used in the front, back, top, bottom, side or any portion thereof.

The examples demonstrate beneficial features of the present invention as a protective housing. More specifically, the examples describe experiments conducted where harmful effects were reduced or minimized by adapting an electronic device such as a cellular telephone with a polymeric material according to the present invention. The examples also demonstrate the ordinary use of traditionally housed cellular telephones effect the chemistry in the brain. Particular abnormal activity was found in the frontal and temporal lobes. In addition, abnormal shifts in minerals and hormones were also observed. However, when the housing was adapted with a polymeric material according to the present invention, activity in the frontal and temporal lobe was deemed normal or more normal than without. Also, the abnormal shifts identified in minerals and hormones were not observed when using a housing according to the present invention. Thus, the studies demonstrate through EIS analysis, that a polymeric material including a polyamide, barium sulfate and magenesium sulfate is effective at protecting humans against electromagnetic radiation.

Housings of the present invention are not limited to cellular telephones but instead are intended for use with a variety of electronic devices that emit EMR, The polymeric material of the present invention may be formed into a housing or portion thereof for a number of household appliances including refrigerators, microwaves, blenders, coffeemakers, food processors and the like. Moreover the housings may be used for entertainment devices such as televisions, stereos, portable audio players such as MP3 players, and computers. Housings of the present invention may also be used for electronic devices such as telephones, cordless telephones, headphones, wireless headphones and the like. Thus any electrical device that emits a frequency similar to any of the devices provided herein may be adapted with a housing according to the present invention. In some embodiments, the housing of the present invention is provided to protect against frequencies in the MHz range. In other embodiments, housings according to the present invention are provided to protect against frequencies in the GHz range. If testing is desired, electro interstitial scanning is one method that may be used to detect changes in biological state after exposure to the electronic device with and without the protective housing. Another method is to test the protective capabilities using a "phantom head" or "phantom body" that mimics the conductivity or dielectric constant of the exposed region.

The polymeric material of the present invention also provides a particular utility as a fabric in preparation of protective garments and the like. If exposed to electromagnetic radiation, the protective garment may help reduce or minimize adverse effects associated with exposure. Examples of particular garments are any known in the art and may include hats, jackets, shirts or blouses, pants, gloves, boots or shoes and the like. The garments may have particular utility in industries where electronic device manufacturing or testing occurs. It is therefore another aspect of the present invention to provide a fabric for the protection of a user against exposure to electromagnetic radiation. The fabric includes a polyamide, such as nylon-6 or nylon-6, 6; barium sulfate; and magnesium sulfate. The fabrics provided herein, upon exposure to incident electromagnetic radiation are believed to emit subtle electromagnetic oscillations at probiotic frequencies that protect the user against the incident electromagnetic radiation. Since the present invention retains many of the characteristics as conventional nylons, the methods used to form fibers and fabrics from nylons may also be used with the present invention. In particular the methods of forming fibers and fabrics from nylon-6, 6 and nylon-6 can be used with the present invention. As general guidance, once the polymer material including the polyamide, barium sulfate and magnesium sulfate is formed, the material may be extruded into fibers through pores, such as those provide in an industrial spinneret. During extrusion the individual polymer chains tend to align because of viscous flow. If subjected to cold drawing afterwards, the fibers align further, increasing their crystallinity, and the material acquires additional tensile strength. In practice, fibers incorporating the polymeric material of the present invention for fabrics are most likely to be drawn using heated rolls at high speeds. The resulting fibers may then be woven into fabric and thus used the preparation of garments having protective features.

The preferred embodiments have described a variety of compositions useful for the protection against electromagnetic radiation. Though nonlimiting, the polymeric material of the present invention is believed to oscillate upon incident radiation. The oscillation is believed to generate a subtle, low frequency, non-coherent electromagnetic field (random field) that can affect the hydrogen lattice of the molecular structure of water and thus modify the electrodynamic properties of water. The low frequency oscillation is of a frequency lower than the incident radiation. It is believed these low frequency oscillations emitted from the polymeric material can be carried by higher frequencies generated by electronic devices, without adverse interaction and thus can be delivered in combination with the harmful frequency for desired protection.

The biological effect of exposure to electromagnetic radiation is not fully understood however it is believed the electromagnetic radiation affects the water molecules and hydrogen bonds within the body. It is believed the oscillations generated by the compositions of the present invention protect against such effect by causing the reorganization of the water clathrate structures. This reorganization is believed to be beneficial and help prevent adverse reactions from exposure to the higher frequencies emitted from electronic devices.

It will be evident to one skilled in the art that there are numerous embodiments of the present invention that are not expressly described herein, but which are clearly within the scope and spirit of the invention. The description is provided to demonstrate a variety of preferred embodiments only.

EXAMPLES

Example 1

Figure 1A:
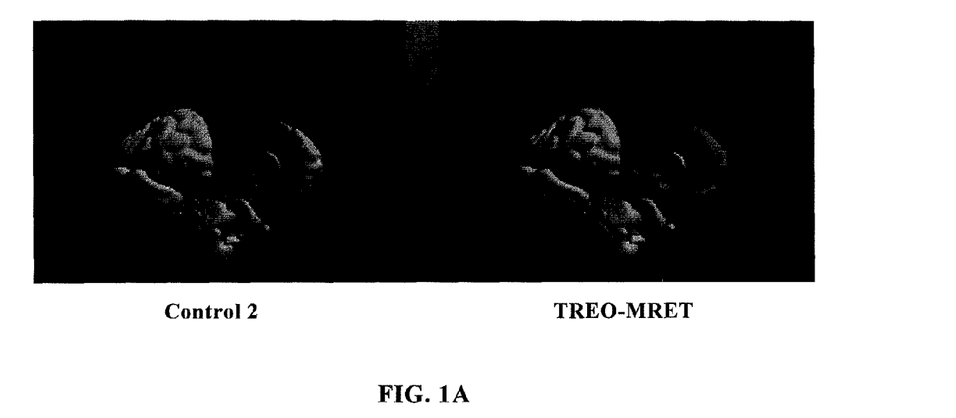
FIG. 1A depicts a pictorial image of EIS analysis of the brain and FIGS. 1B-1C depict the corresponding data tables from EIS testing of a representative subject after exposure to electromagnetic radiation from a cellular telephone placed in close proximity to the subject's right ear, with and without a polymeric material of the present invention. As can be viewed pictorially in FIG. 1A and by consideration of the data provided in FIGS. 1B-1C, in the control (without the polymeric material of the present invention), the subject's right frontal lobe showed abnormal values along with abnormal values from the left temporal lobe, hypothalamus, and left amygdala, and were pictorially displayed as yellow, which corresponds to elevated conductivity, viscosity or acute inflammation. However, positive effects were identified when using the polymeric material of the present invention in combination with the cellular telephone (labeled TREO-MRET) at the right temporal lobe and more significantly for the right frontal lobe. Additional positive effects were detected in blood pressure, blood viscosity, ATP values and mitochondrial activity, oxygen levels, and carbon dioxide levels when using the polymeric material of the present invention.
Figure 1B:
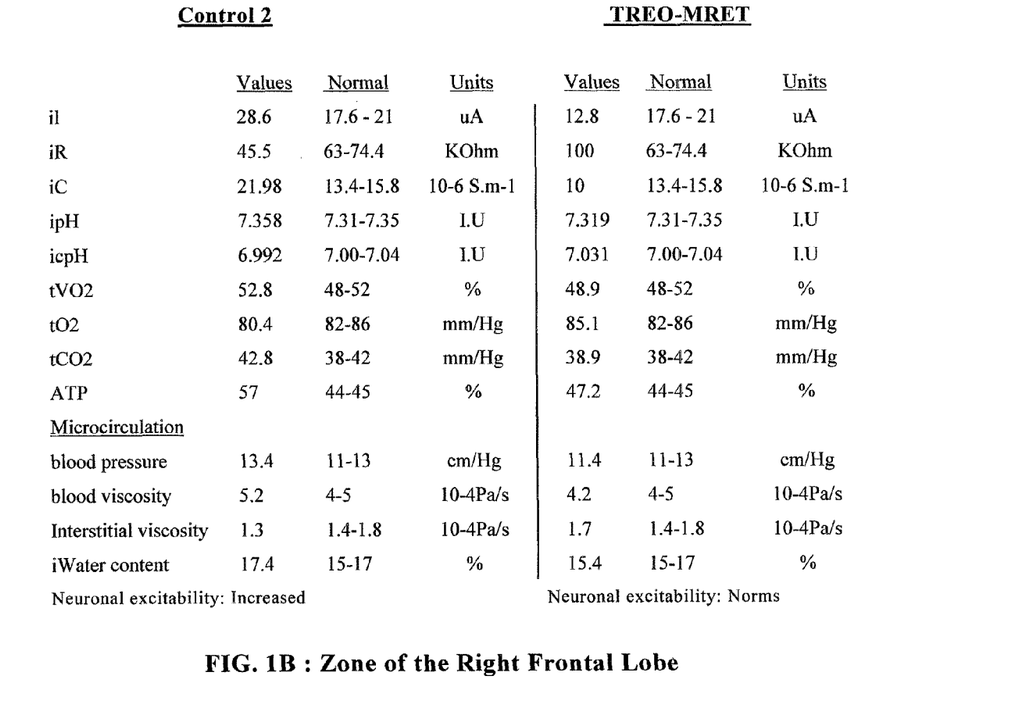
Figure 1C:
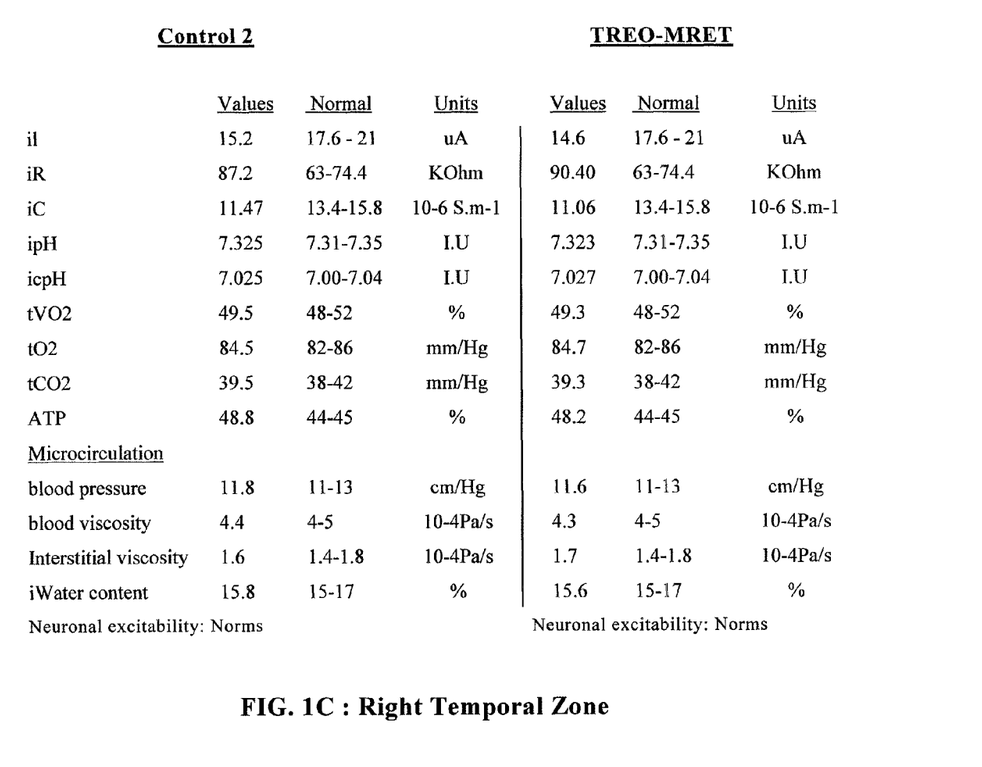

Electro Interstitial Scan (EIS) Comparison Between Exposure to Commercially Available Cellular Telephone (RF Phone) and Cellular Telephone with MRET Housing Among Human Subjects EIS analysis was conducted at an independent testing facility to assess the biological effects of electromagnetic radiation from a cellular telephone on the human body and whether effects would differ if using a cellular telephone housed in a polymeric material of the present invention (herein referred to as MRET). In summary it was found that exposure to the cellular telephone without MRET caused significant shifts in brain chemistry within the right frontal and temporal lobe; whereas exposure to the cellular telephone with MRET did not show the adverse shifts. A representative example is provided as FIGS. 1A-1C. In addition levels of insulin, ACTH and TSH were also believed to be adversely effected after exposure to the cellular telephone without MRET. The adverse shifts in brain chemistry due to the exposure to the cellular telephone worsened over time. Although initial effects were difficult to detect, after 20 minutes from halting exposure, the biological effects continued to deteriorate, which suggest the effects from cellular phone usage continue beyond the initial exposure. The majority of the deleterious effects were lessened or mediated after use with the cellular telephone using MRET suggesting MRET plays an important role in preventing or correcting adverse effects from exposure to electromagnetic radiation.

Materials and Methods

The experiments detected changes in brain chemistry using Eletro Interstitial Scanning (EIS). Subjects were scanned at four time points. The first scan was conducted before any exposure. The second scan was conducted after 5 minutes of exposure to a TREO 650 cellular telephone (referred to herein as TREO RF) which operates at frequencies of about 1851.25-1908.75 MHz (PCS and CDMA frequencies). The TREO RF was placed next to the individual's right ear. The subject was then scanned after waiting 20 minutes. A TREO 650 cellular telephone adapted with a housing including the polymeric material of the present invention (referred to as TREO-MRET) was then used. The last scan occurred after 20 minutes of exposure to TREO 650 MRET.

EIS gives a comprehensive overview of the reactions of the body. 3D models of the full body and various different parts of the body are created based on the electro interstitial gram (EIG). The models are color coded to indicate where areas of imbalance are hyper-functioning or hypo-functioning. In essence, EIS provides a functional assessment of the main organs, with report screens that show interstitial biochemical values and an evaluation of body composition including lean mass, fat mass and hydration data. Measurements are further extrapolated to provide report screens with hormone, electrolyte, neurotransmitter and oxidative stress analyses. More specifically, the EIS system operates as a biosensor, which analyzes the interstitial fluid locally in vivo by application of a D.C. current between cutaneous zones using electrodes. In use, the EIS introduces electric signals of low intensity (1.28V D.C.) through the human body via 6 electrodes. This is painless and has no negative effects to the patient. About 22 measurements are taken. The scanning results are recorded by EIS software, which analyzes and interprets the test results and produces a variety of informative models, graphs and data for interpretation by a medical practitioner.

Results from Subject 1: 42 yr Old Female

Initial EIS showed reduced conductivity (hypo-activity) in the right and left frontal lobes, intra-cranial vessels and right temporal lobe before exposure. This was believed to be stress-related. Thus the effect of 5 minute exposure to the TREO RF was initially not conclusive. Further analysis showed endogenous chatecholamines sharply decreased after exposure to TREO RF, which corresponds to low adrenal medullary hormone and thus TREO RF appears to adversely affect neurotransmitter activity. Dopamine levels after TREO RF also dropped.

Despite abnormal values for frontal lobes, temporal lobes, intra-cranial vessels and amygdalas from measurements taken after 20 minutes from the earlier scan, positive effects after TREO-MRET exposure included: decreased cranial blood pressure; decreased cranial blood viscosity, decreased carbon dioxide levels, and decreased intra-cranial blood pressure. The values, which were statistically below the norm for the general population, were deemed positive in proportion to the subject's low values overall. An increase in phosphorous and a decrease in calcium was detected suggesting mineral balance may be slightly affected by the TREO-MRET however no shift in hormone levels was identified.

Results from Subject 2: 48 yr Old Female

The initial scan showed reduced oxygen levels and increased carbon dioxide levels believed to be associated with a fast paced lifestyle. Immediately after exposure to TREO RF, reductions in elevated values for the frontal lobe were identified. Blood pressure, $H_2O$ content, and ATP levels were adversely increased in the right temporal lobe. These adverse effects are believed to be associated with exposure to TREO RF.

After waiting 20 minutes and before exposure to TREO-MRET, EIS showed significant abnormal values in the right temporal lobe, left temporal lobe, hypothalamus and left amygdala. Abnormal values in insulin, ACTH and TSH were also identified. In addition, measurements of the vertebral column suggesting nerve supply worsened. It is believed the negative effects associated with TREO RF continued over time.

After exposure to the TREO-MRET, positive effects were identified for blood pressure, blood viscosity, ATP values and mitochondrial activity, oxygen levels and carbon dioxide levels. In addition, positive effects were detected in values of insulin, ACTH, cortisol, thyroid hormone and TSH. Improvement in the vertebrae was also identified.

Results from Subject 3: 42 yr Old Male

The initial scan showed abnormal levels in the right frontal lobe prior to testing. In addition, elevated intra-cranial blood pressure and hyperactivity of the temporal lobes was also shown. Because of the initial heightened values it was difficult to assess whether some of the changes in brain chemistry immediately after 5 minute exposure to the TREO RF occurred.

After waiting 20 minutes and before exposure to TREO-MRET, EIS showed abnormal values in potassium, ACTH, insulin and cortisol. Abnormally high values were observed for dopamine. Abnormally low values were observed for catecholamine and serotonin. After exposure to TREO-MRET, insulin levels were improved but still below normal. Levels of cellular potassium, ACTH, catecholamine, dopamine and serotinin were normal after exposure to TREO-MRET.

Example 2

Detection of Amplitude of Electromagnetic Radiation Emitted from a Cellular Telephone with and without the Polymeric Material and its Effect on a "Phantom Head"

The present example demonstrates the ability of the polymeric material of the present invention to reduce the effects of electromagnetic radiation on a "phantom head," which mimics the human head muscle and brain tissue composition. The intensity and localization of electromagnetic intensity was measured. The results showed a significant decrease in electromagnetic radiation intensity but no significant shift in localization indicating the polymeric material successfully reduces potential harmful effects on brain chemistry due to electromagnetic exposure. The study was performed using a variety of wireless mobile phones and is described in more detail below.

To assess the protective effects of using the polymeric material of the present invention against exposure to radiation, a "phantom head" was formed to mimic the brain and muscle composition within the head. The "phantom head" was produced using a combination of hydroxyethylcellulose (FEC) gelling agent and saline solution. The mixture was calibrated to obtain proper dielectric constant (permittivity) and conductivity of the simulated tissue. The dielectric constant at about 835 MHz was about 40 and at about 1900 MHz, was about 39. The conductivity at about 835 MHz was about 0.88 mho/m, and the conductivity at about 1900 MHz was about 1.43 mho/m. An APREL Laboratories ALSAS system with a dosimetric E-field probe E-020 was used for measurements. The dipole was oriented parallel to the body axis. The investigation was conducted on cellular phones including Sanyo Model PM-8200(S), Kyocera Wireless Model 2325 and LG Model VX6000.

Wireless mobile phones were evaluated in this experiment for localized specific absorption rate (SAR) for controlled environment/occupational exposure limits specified in ANSI/EEE Std. C95.1-1992 and had been tested in accordance with the measurement procedures specified in IEEE 1528-2003 and OET Bulletin 65. The RF phone was placed into simulated transmit mode using the manufacturer's test codes. Such test signals offer a consistent means for SAR and are recommended for evaluating of SAR data. Each SAR measurement was taken with a fully charged battery. In order to verify that each phone was tested at full power, conducted output power measurements were performed before and after each SAR test to confirm the output power. SAR measurement results were obtained, analyzed and compared to provide the scientific conclusion of the experiment.

The protective polymers were prepared with and without the polymeric material according to the present invention. In the experimental polymer, about 1 gram of polymeric material was used (referred to as MRET polymeric material), whereas the control contained no MRET polymeric material. The resulting polymers were placed in an exposed jack then positioned next to the phantom head for measurement. Control and the experimental conditions were compared to determine differences in electromagnetic radiation intensity and localization of signal. The results were displayed as a heat map, which demonstrates the positioning and intensity of signal as hot spots and cool spots.

Figure 2A:
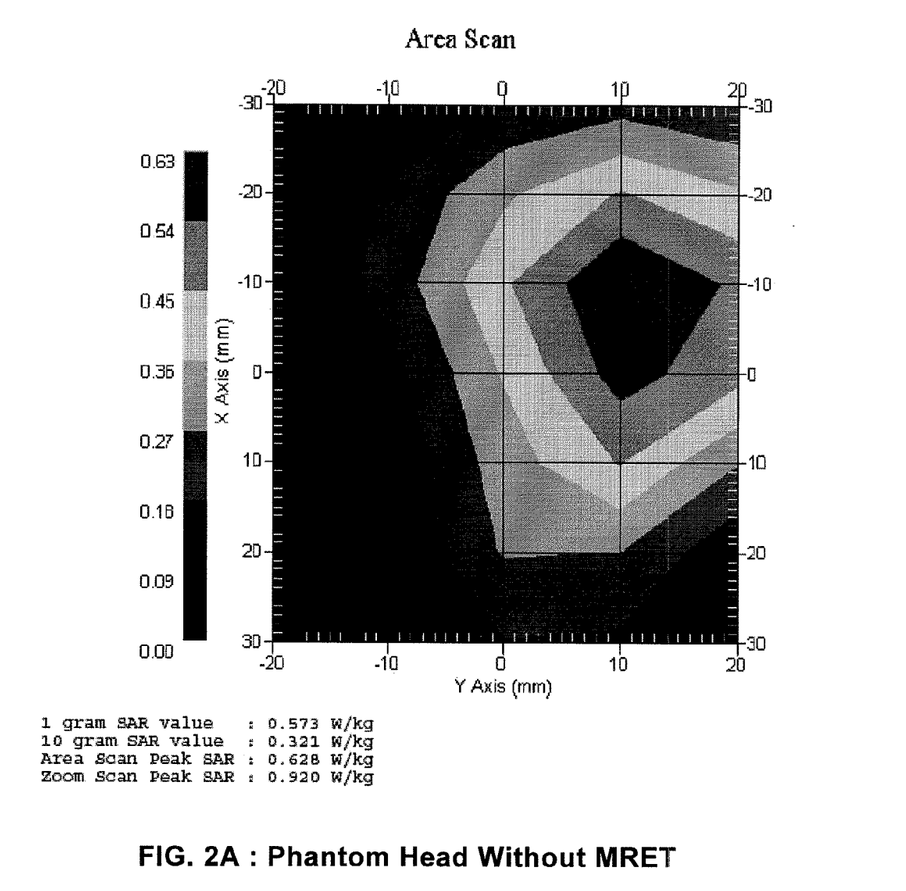
FIGS. 2A and 2B depict heat maps of a representative "phantom head" study, which detected the intensity and localization of electromagnetic radiation upon exposure from a cellular telephone incorporating a polymer with and without the polymeric material of the present invention. Thus, the "phantom head" study provides SAR testing of representative embodiments of the present invention.
Figure 2B:
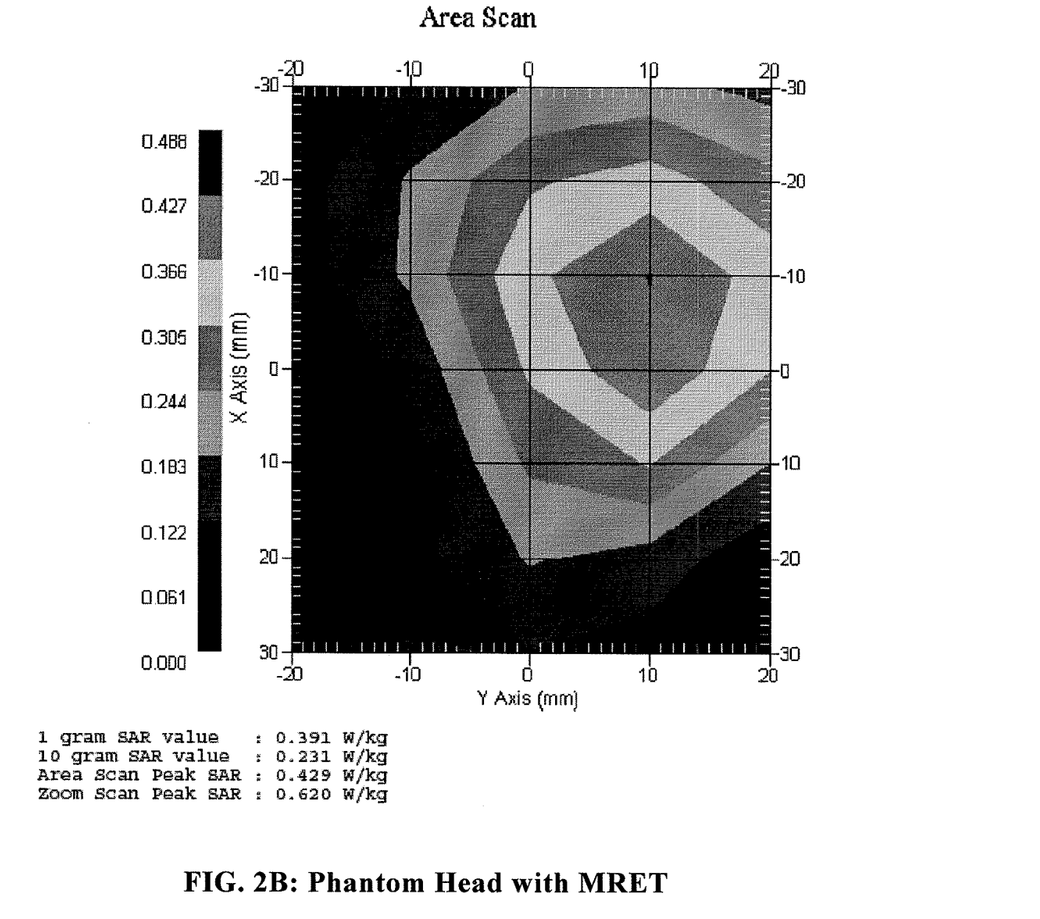

Referring to FIGS. 2A and 2B, the analysis of "Hot Spot" Area Scan data provides evidence that the incorporation of 1 gram of MRET polymeric material in the protective polymer for the RF phones affects the amplitude of emission but does not change location of the "Hot Spot". More specifically, the incorporation of 1 gram of MRET polymeric material protected the "phantom head" against the intensity of the electromagnetic radiation, while showing that the signal remained in substantially the same location as without the MRET polymeric material. Thus intensity was largely affected, whereas localization was not. The intensity of electromagnetic radiation when incorporating the MRET polymeric material decreased the amplitude in 80% of the data points. 60% of the data points were observed to have a significant decrease in SAR values in the range of 10% to 50%. Thus the incorporation of the MRET polymeric material in the "phantom head" leads to the reduction of the majority of SAR values. 12 SAR values out of 16 meaningful SAR values in this experiment were reduced in the range of 16.5%-32.6%, and only 3 SAR values increased by 1.0%-5.6%.

What is claimed is:

1. A method of protecting a subject against adverse effects associated with exposure to electromagnetic radiation, comprising:
   a) providing a device that emits electromagnetic radiation throughout an exposure area;
   b) forming a protective housing comprising a polymeric material that comprises a polyamide of nylon 6 or nylon 6, 6, barium sulfate, and magnesium sulfate;
   c) housing the device in the protective housing to protect a subject against adverse effects associated with exposure to electromagnetic radiation within the exposure area; and
   d) positioning the device such that the subject is within the exposure area.

2. The method according to claim 1, wherein the device is selected from the group consisting of a cellular telephone, a cordless telephone, an audio player, a wireless headset, a headphone, a computer and a television.

3. The method according to claim 1, wherein the polymeric material upon exposure to the electromagnetic radiation emits electromagnetic oscillations that counter adverse effects associated with the electromagnetic radiation.

4. The method according to claim 1, wherein the housed device is positioned to contact the subject's body.

5. The method according to claim 1, wherein the device emits a frequency of about 835 MHz to about 2000 MHz.

6. The method according to claim 5, wherein the device is a cellular telephone.

7. The method according to claim 1, wherein the polymeric material is formed by covalently bonding the barium sulfate and magnesium sulfate to the polyamide by ester linkages and polymerizing the polyamide.

8. The method according to claim 7, wherein the polymeric material is about ten parts by weight polyamide, about two parts by weight barium sulfate and about one part by weight magnesium sulfate.

9. The method according to claim 1, wherein the polymeric material consists essentially of the polyamide of nylon 6 or nylon 6, 6, barium sulfate, and magnesium sulfate.

10. The method according to claim 9, wherein the polymeric material is about ten parts by weight polyamide, about two parts by weight barium sulfate and about one part by weight magnesium sulfate.

11. The method according to claim 1, wherein before the step of housing the device, the method further comprises the step of testing the device to determine whether adverse effects are associated with exposure to electromagnetic radiation from the device.

12. The method according to claim 11, wherein the step of forming the protective garment comprises:
 i) covalently bonding the barium sulfate and magnesium sulfate to the polyamide by ester linkages;
 ii) polymerizing the polyamide to form a polymeric fabric; and
 iii) tailoring the fabric to form the garment.

13. The method according to claim 11, wherein the polymeric material is about ten parts by weight polyamide, about two parts by weight barium sulfate and about one part by weight magnesium sulfate.

14. The method according to claim 11, wherein the polymeric material upon exposure to incident electromagnetic radiation emits electromagnetic oscillations that counter adverse effects of the incident electromagnetic radiation.

15. A method of protecting a subject against adverse effects associated with exposure to electromagnetic radiation, comprising:
 a) providing a device that emits electromagnetic radiation throughout an exposure area;
 b) forming a protective garment from a polymeric material that comprises a polyamide of nylon 6 or nylon 6, 6, barium sulfate, and magnesium sulfate; and
 c) providing a subject wearing the protective garment within the exposure area.

* * * * *